(12) United States Patent  (10) Patent No.: US 9,063,376 B2
Mizumura  (45) Date of Patent: Jun. 23, 2015

(54) EXPOSURE DEVICE OF AN ALIGNMENT MATERIAL FILM

(75) Inventor: Michinobu Mizumura, Yokohama (JP)

(73) Assignee: V TECHNOLOGY CO., LTD., Yokohama-Shi, Kanagawa (JP)

( * ) Notice: Subject to any disclaimer, the term of this patent is extended or adjusted under 35 U.S.C. 154(b) by 132 days.

(21) Appl. No.: 13/824,263

(22) PCT Filed: Aug. 16, 2011

(86) PCT No.: PCT/JP2011/068576
§ 371 (c)(1),
(2), (4) Date: Mar. 15, 2013

(87) PCT Pub. No.: WO2012/035920
PCT Pub. Date: Mar. 22, 2012

(65) Prior Publication Data
US 2013/0169917 A1    Jul. 4, 2013

(30) Foreign Application Priority Data
Sep. 17, 2010 (JP) ................................. 2010-208773

(51) Int. Cl.
*G02F 1/1337* (2006.01)
*G02F 1/13* (2006.01)
*G03F 7/20* (2006.01)

(52) U.S. Cl.
CPC ............ *G02F 1/1337* (2013.01); *G02F 1/1303* (2013.01); *G02F 1/133788* (2013.01); *G02F 2001/133757* (2013.01); *G03F 7/708* (2013.01)

(58) Field of Classification Search
CPC .... G02F 1/1303; G02F 1/13378; G03F 7/201
USPC ................... 349/124, 129; 430/20, 320–322; 250/492.1
See application file for complete search history.

(56) References Cited

U.S. PATENT DOCUMENTS

| 6,600,538 | B1 | 7/2003 | Shiomi et al. |
| 2003/0025864 | A1 | 2/2003 | Chida et al. |
| 2003/0091939 | A1* | 5/2003 | Shin .............................. 430/319 |

(Continued)

FOREIGN PATENT DOCUMENTS

| JP | 2001-042365 A | 2/2001 |
| JP | 2003-043492 A | 2/2003 |
| JP | 2006-309181 A | 11/2006 |
| JP | 2007-041175 A | 2/2007 |

(Continued)

OTHER PUBLICATIONS

International Search Report in PCT/JP2011/068576 dated Sep. 13, 2011 (English Translation Thereof).

*Primary Examiner* — Michael Caley
(74) *Attorney, Agent, or Firm* — McGinn IP Law Group, PLLC

(57) ABSTRACT

In an exposure device, picture elements or pixels of a liquid crystal display device are split into two parts in the width direction, and exposed from different directions, whereby an alignment material film is photoaligned. The exposure device causes two beams of exposure light outputted by two light sources (a first light source and a second light source to be transmitted through respectively different light transmission regions in a predetermined pattern of a mask, to irradiate regions of an alignment material film formed on a member for exposure, which regions correspond to split regions of pixels or picture elements. The exposure device causes the two beams of exposure light to mutually intersect on the optical path between the first and second light sources and the alignment material film.

16 Claims, 11 Drawing Sheets

(a)

(b)

(56) References Cited

U.S. PATENT DOCUMENTS

| | | |
|---|---|---|
| 2010/0035190 A1* | 2/2010 | Jung et al. .................... 430/322 |
| 2010/0188623 A1 | 7/2010 | Nakagawa |
| 2011/0187974 A1 | 8/2011 | Chida et al. |
| 2012/0077115 A1 | 3/2012 | Chida et al. |

FOREIGN PATENT DOCUMENTS

| | | |
|---|---|---|
| JP | 2007-219191 A | 8/2007 |
| JP | 2009-294609 A | 12/2009 |
| JP | 2010-039485 A1 | 2/2010 |
| WO | WO 2009/037889 A1 | 3/2009 |

* cited by examiner

FIG. 1
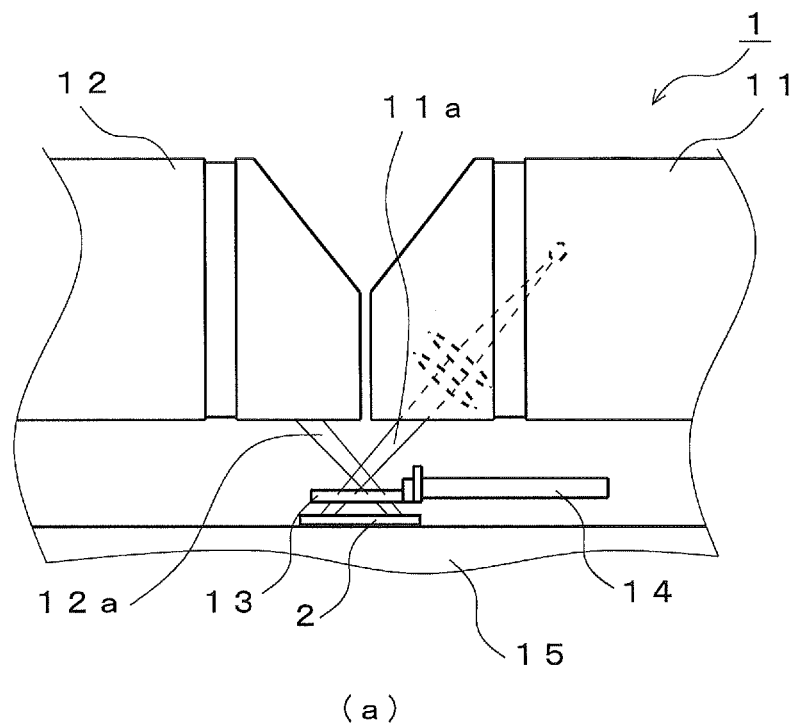
(a)
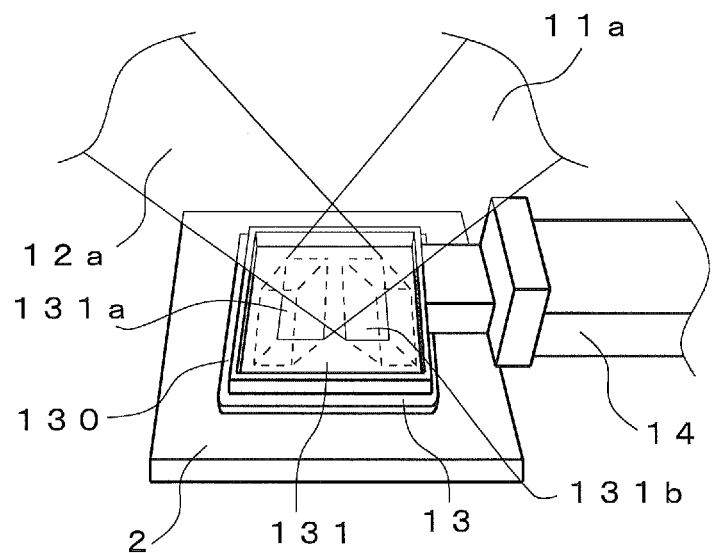
(b)

FIG. 5
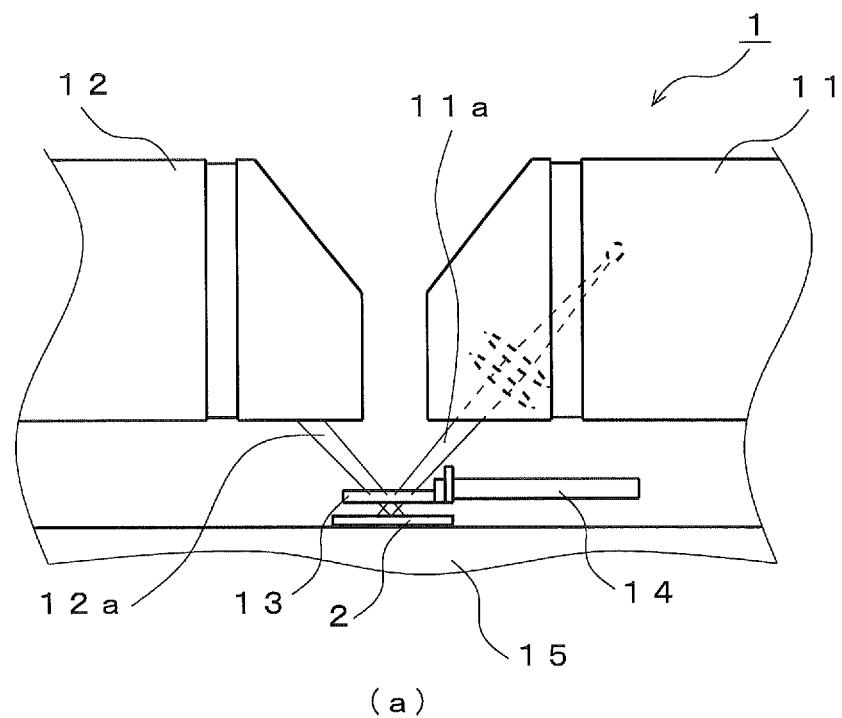
(a)
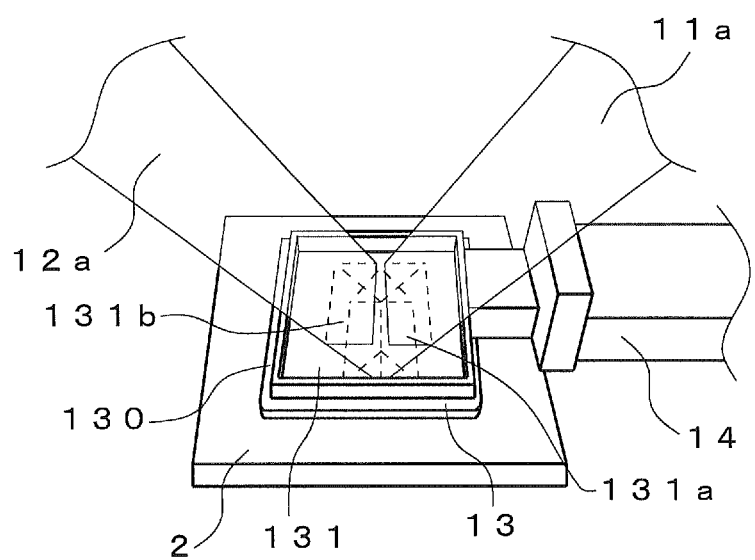
(b)

FIG. 7
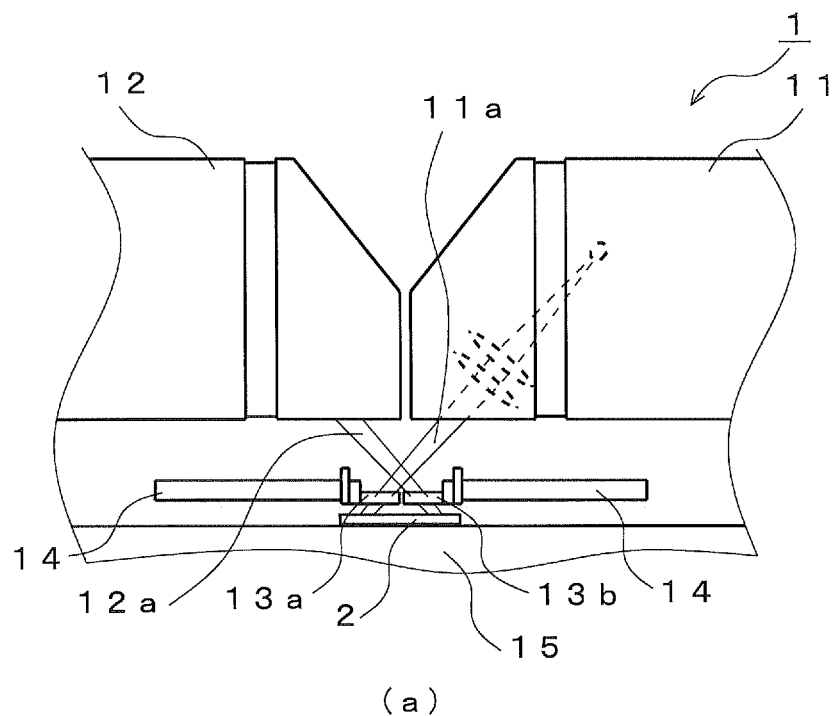
(a)
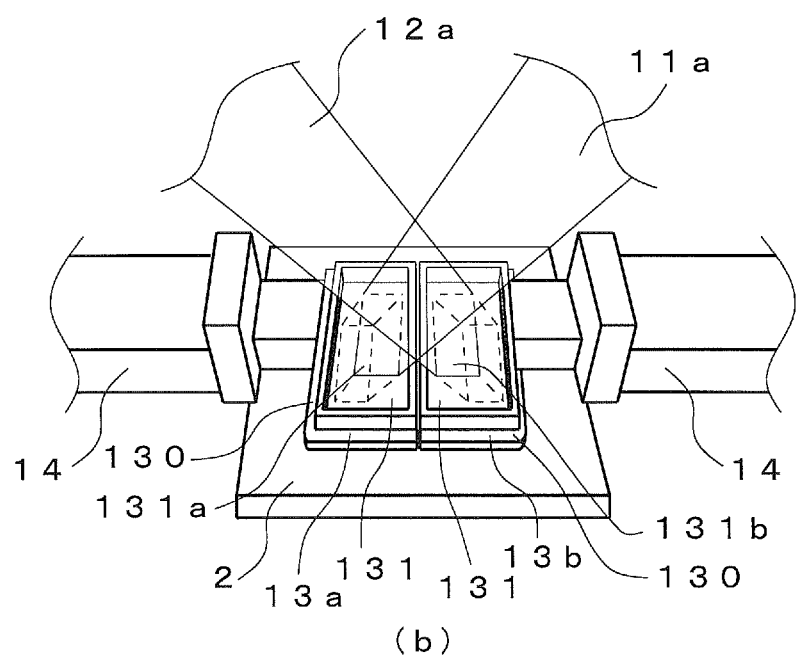
(b)

FIG. 9
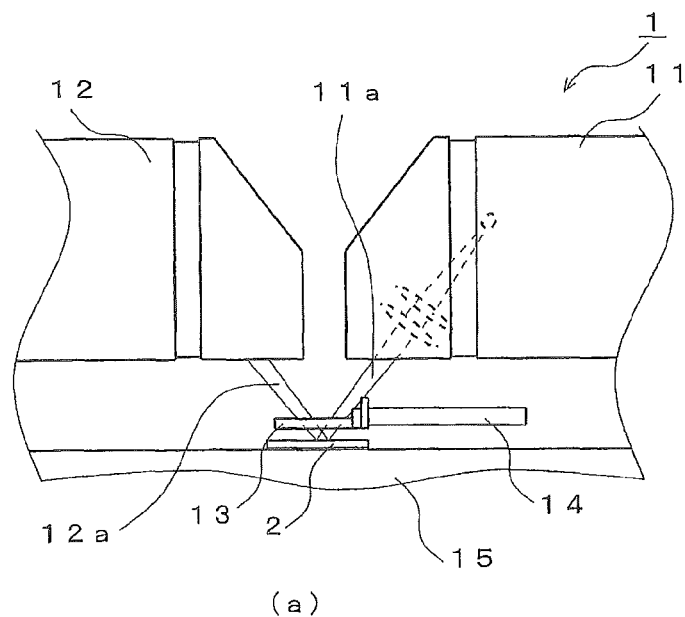
(a)
Related Art
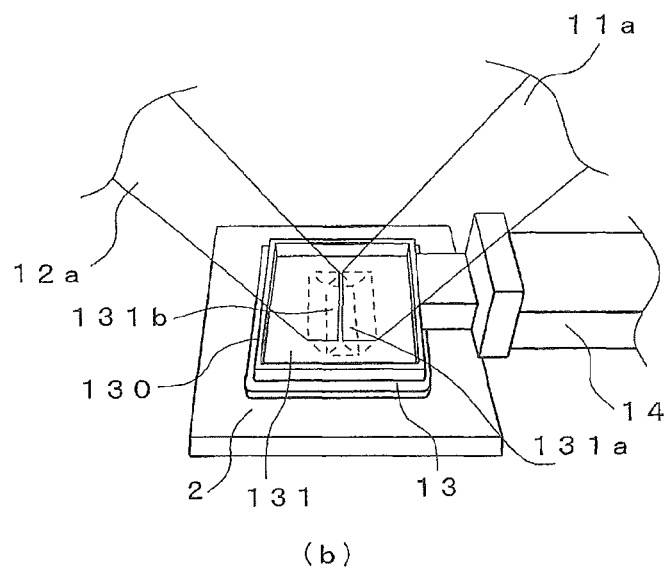
(b)
Related Art

Related Art

EXPOSURE DEVICE OF AN ALIGNMENT MATERIAL FILM

TECHNICAL FIELD

The present invention relates to an exposure device for producing, by a multidomain exposure technique, an alignment material film for a liquid crystal display device that displays three-dimensional images; and relates in particular to an exposure device for photoalignment of an alignment material film by splitting portions of the alignment material film which correspond to picture elements of the liquid crystal display device into two parts, and exposing these from different directions; or by exposing portions which correspond to pixels from a different direction in each adjacent pixel in the width direction thereof.

BACKGROUND ART

In the past, liquid crystals constituted by calamitic molecules comprising a plurality of benzene or cyclohexane molecules with modifying groups at both ends have been used in liquid crystal displays and like, for example. Adjustments to viewing angle and contrast of the display are made by causing the calamitic liquid crystals to orient in a uniform direction.

In the past, to orient the liquid crystal molecules, an alignment film comprising, for example, a polyimide or the like, is formed on the surface of the glass substrates for sandwiching the liquid crystals, thereby orienting the liquid crystal molecules in a predetermined direction coincident with the alignment direction of the alignment film, through sandwiching of the liquid crystals between the alignment films.

In one example of a production method adopted when forming an oriented film on the surface of a glass substrate, a polyimide solution, for example, is coated and baked onto the glass substrate, forming a polyimide film (alignment material film) several tens of nanometers thick, and thereafter the surface of the polyimide film (alignment material film) is rubbed in one direction with a rubbing roller having cloth wound about the surface (for example, Patent Document 1).

However, with methods that involve orienting the liquid crystal molecules by forming an alignment film on a glass substrate surface, due to the adoption of production methods like that described above to form the alignment film, the alignment film may become scratched by rubbing cloth that is shed by the roller as it is rubbed or by dust sloughed off from the polyimide film or the like, or the dust itself may become deposited on the surface of the alignment film. A resultant problem is that this tends to lead to display nonuniformities and display defects of the liquid crystal display.

In order to solve this problem, there has recently been proposed a technique, called photoalignment, which uses ultraviolet light to align the alignment material film. Specifically, by irradiating an alignment material film of polyimide, azobenzene, or the like with linear polarized or unpolarized ultraviolet light, the alignment material film becomes aligned in the same direction, due to its photodegradation characteristics. Consequently, alignment films of good alignment can be formed by a non-contact process, preventing display nonuniformities and display defects of the liquid crystal displays and the like.

However, with photoalignment, in the event that the alignment material film is irradiated with ultraviolet light exclusively from a single direction, the alignment direction of the alignment film will be a single direction only, and therefore the liquid crystal molecules sandwiched between the alignment films will orient in a single given direction exclusively. A consequent problem is that the liquid crystal display or the like will have a narrow viewing angle.

In order to solve this problem, there has recently been proposed an alignment material film exposure technique called multidomain alignment (for example, in Patent Documents 2 to 4). FIG. 9 is a schematic view showing exposure in conventional multidomain alignment, wherein FIG. 9(a) is a side view showing multidomain alignment exposure in a conventional exposure unit, and FIG. 9(b) is a perspective view thereof. As shown in FIG. 9, in an exposure unit of employing a multidomain alignment system, exposure light 11a, 12a from two different light sources (a first light source 11 and a second light source 12) is output at mutually different output angles, whereupon the exposure light 11a, 12a is transmitted through a mask 13 disposed between the first light source 11, the second light source 12, and a member for exposure 2. FIG. 10 is a drawing showing the mask in this multidomain alignment system exposure unit, and an alignment film formed by a single exposure. As shown in FIG. 9(b), the mask 13 is constituted by a frame 130 and a pattern formation portion 131 at the center thereof; as shown in FIG. 10, a first light-transmitting region group 131a and a second light-transmitting group 131b in each of which a plurality of light transmission regions are arrayed in one row are formed in the pattern formation portion 131, in correspondence with the respective exposure light from the first light source 11 and the second light source 12. The first light-transmitting region group 131a and the second light-transmitting group 131b are disposed spaced apart in the relative scanning direction of the alignment material film with respect to the mask 13, with the respective plurality of light transmission regions corresponding to regions split to one-half the picture element width. The light transmission regions of the first light-transmitting region group 131a and the second light-transmitting group 131b are arrayed with gaps between them, so that there is no overlap in the scanning direction. As shown in FIG. 10(b), the respective light transmission regions of the first and the second light-transmitting group 131a, 131b are formed such that a plurality thereof (in FIG. 10(b), six) are lined up in the scanning direction. By irradiating these respectively different regions 131a, 131b of the mask 13 from different directions with the exposure light 11a, 12a from the first and second light sources 11, 12, the light transmitted through the light transmission regions irradiates and exposes the alignment material film on the surface of the member for exposure 2, which is supported on a stage 15. In so doing, through a single exposure, in both the direction of split (width direction) of the picture elements and the lengthwise direction perpendicular thereto (the scanning direction), respectively, the alignment material film is exposed by the exposure light transmitted through the plurality of light transmission regions, forming an alignment film in such a way that a plurality of regions, which correspond to picture elements and have uniform alignment direction, line up in the width direction and lengthwise direction, as shown in FIG. 10(c).

In this case, due to the respectively different angles of slope of the exposure light 11a, 12a with respect to the surface being exposed, an alignment film aligned in two directions is obtained. Consequently, sections that will constitute the R (red), G (green), and blue (B) picture elements of a liquid crystal display or the like are split into halves respectively irradiated by the exposure light 11a, 12a. In so doing, two alignment directions of the alignment film are created within each single picture element of the liquid crystal display or the like, and the liquid crystal molecules can be oriented in two directions. In so doing, the viewing angle of the liquid crystal display or the like can be made wider. Moreover, in a multidomain alignment system exposure unit such as this, rather than lining up a plurality of the light transmission regions of the mask shown in FIG. 10 in the scanning direction, the light transmission regions could instead be constituted to extend in the scanning direction, making these light transmission regions correspond to regions that include a plurality of pixels lined up in the scanning direction; and by continuously transmitting light through these light transmission regions, regions having uniform alignment directions can be formed in the alignment film so as to extend in a band in the scanning direction. In so doing, an alignment film in which each of the regions that will constitute adjacent pixels in the width direction has a different alignment direction is manufactured.

PRIOR ART DOCUMENTS

Patent Documents

Patent Document 1: Japanese Laid-open Patent Application 2009-294609
Patent Document 2: Japanese Laid-open Patent Application 2010-39485
Patent Document 3: Japanese Laid-open Patent Application 2001-42365
Patent Document 4: Japanese Laid-open Patent Application 2003-43492

DISCLOSURE OF THE INVENTION

Problems the Invention is Intended to Solve

However, the aforedescribed prior art has problems such as the following. In a multidomain alignment system exposure unit, the mask stage 14 that supports the mask 13 is disposed towards one of the two light sources. Consequently, the conventional exposure unit has the problem that, in cases in which the direction in which the alignment film is to be aligned necessitates a small angle of the exposure light 11a with respect to the surface being exposed, the top part of the mask stage 14 (section A in FIG. 11) will be positioned on the optical path of the exposure light 11a, as shown in FIG. 11, and will interfere with the exposure light 11a, so that the alignment film cannot be exposed in the predetermined pattern.

Moreover, as shown in FIGS. 9 to 11, in the conventional exposure unit, the exposure light 11a, 12a output from the first and second light sources 11, 12 are respectively transmitted through regions that respectively lie closer towards the light source side from the mask 13. Consequently, in a case in which the angle of the exposure light 11a, 12a with respect to the surface being exposed is small, it is necessary for the distance between the first and second light sources 11, 12 to be long, creating the problem of a larger size of the exposure device.

With the foregoing in view, it is an object of the present invention to provide an exposure device for manufacture, through exposure by a multidomain alignment system, of an alignment material film for use in a liquid crystal display device that displays three-dimensional images, wherein the exposure device can expose the alignment material film to a predetermined pattern in the normal fashion, even in cases necessitating a small slope angle of the exposure light with respect to the surface being exposed, so that a more compact size is possible.

Means for Solving the Problems

The exposure device according to the present invention is an exposure device for splitting sections of an alignment material film corresponding to picture elements of a liquid crystal display device into two parts in the width direction thereof and exposing the film from different directions, whereby the alignment material film is photoaligned; the exposure device having: a first and a second light source for outputting exposure light; a mask in which there are formed a first light transmission region group and a second light transmission region group in which a plurality of light transmission regions for transmitting the exposure light from the first and second light sources is arrayed in single rows; and a mask support portion for supporting the mask, the mask support portion being disposed towards the first light source; the first and second light transmission region groups being disposed spaced apart in the direction of relative scanning of the alignment material film with respect to the mask; the plurality of light transmission regions respectively corresponding to regions equivalent to one-half of one picture element split in the width direction; the light transmission regions of the first light transmission region group and the light transmission regions of the second light transmission region group being arrayed with intervals therebetween such that there is no overlap in the scanning direction; and the exposure light from the first light source and the second light source being caused to mutually intersect on the optical path between the first and second light sources and the alignment material film so that regions of the alignment material film which correspond to split regions of picture elements are irradiated. This exposure device splits in two the picture elements of the liquid crystal display device in the width direction, and exposes the regions in such a way that the respective alignment directions thereof are different directions, and is suited to forming an aligned film having a wide viewing angle.

Another exposure device according to the present invention is an exposure device for splitting sections of an alignment material film corresponding to picture elements of a liquid crystal display device into two parts in the width direction thereof and exposing the film from different directions, whereby the alignment material film is photoaligned; the exposure device having: a first and a second light source for outputting exposure light; a first mask in which is formed a first light transmission region group in which a plurality of light transmission regions for transmitting the exposure light from the first light source is arrayed in a single row; a first mask support portion for supporting the first mask, the mask support portion being disposed towards the second light source; a second mask in which is formed a second light transmission region group in which a plurality of light transmission regions for transmitting the exposure light from the second light source is arrayed in a single row; and a second mask support portion for supporting the second mask, the mask support portion being disposed towards the first light source; the respective plurality of the light transmission regions of the first and second light transmission region groups corresponding to regions equivalent to one-half of one picture element split in the width direction; and the exposure light from the first light source and the second light source being caused to mutually intersect on the optical path between the first and second light sources and the alignment material film so that regions of the alignment material film which correspond to split regions of picture elements are irradiated. This exposure device splits in two the picture elements of the liquid crystal display device in the width direction, and exposes display device in the width direction, and exposes the in such a way that the alignment directions thereof are different directions, and is suited to forming an aligned film having a wide viewing angle.

Yet another exposure device according to the present invention is an exposure device for causing sections of an alignment material film corresponding to pixels of a liquid crystal display device to be exposed from a different direction for each adjacent pixel in the width direction thereof, whereby the alignment material film is photoaligned; the exposure device having: a first and a second light source for outputting exposure light; a mask in which there are formed a first light transmission region group and a second light transmission region group in which a plurality of light transmission regions for transmitting the exposure light from the first and second light sources is arrayed in single rows; and a mask support portion for supporting the mask, the mask support portion being disposed towards the first light source; the first and second light transmission region groups being disposed spaced apart in the direction of relative scanning of the alignment material film with respect to the mask; the respective plurality of light transmission regions corresponding to regions that include a plurality of pixels lined up in the scanning direction; the light transmission regions of the first light transmission region group and the light transmission regions of the second light transmission region group being arrayed with intervals therebetween such that there is no overlap in the scanning direction; and the exposure light from the first light source and the second light source being caused to mutually intersect on the optical path between the first and second light sources and the alignment material film so that regions in the alignment material film that correspond to the regions including a plurality of pixels lined up in the scanning direction are irradiated. This exposure device exposes the pixels of a liquid crystal display device in such a way that the alignment direction is a different direction for each adjacent pixel in the width direction thereof, and is suitable, for example, to form a polarizing film for use as a polarizing film in a 3D display.

Yet another exposure device according to the present invention is an exposure device for causing sections of an alignment material film corresponding to pixels of a liquid crystal display device to be exposed from a different direction for each adjacent pixel in the width direction thereof, whereby the alignment material film is photoaligned; the exposure device having: a first and a second light source for outputting exposure light; a first mask in which is formed a first light transmission region group in which a plurality of light transmission regions for transmitting the exposure light from the first light source is arrayed in a single row; a first mask support portion for supporting the first mask, the mask support portion being disposed towards the second light source; a second mask in which is formed a second light transmission region group in which a plurality of light transmission regions for transmitting the exposure light from the second light source is arrayed in a single row; and a second mask support portion for supporting the second mask, the mask support portion being disposed towards the first light source; the respective plurality of the light transmission regions of the first and second light transmission region groups corresponding to regions that include a plurality of pixels lined up in the scanning direction; and the exposure light from the first light source and the second light source being caused to mutually intersect on the optical path between the first and second light sources and the alignment material film so that regions of the alignment material film that correspond to the regions including a plurality of pixels lined up in the scanning direction are irradiated. This exposure device exposes the pixels of a liquid crystal display device in such a way that the alignment direction is a different direction for each adjacent pixel in the width direction thereof, and is suitable, for example, to form a polarizing film for use as a polarizing film in a 3D display.

In the exposure device according to the present invention, the position of intersection of exposure light from the first light source and exposure light from the second light source is between the first and second light sources and the mask, for example. Alternatively, the position of intersection of exposure light from the first light source and exposure light from the second light source is between the mask and the alignment material film.

Effect of the Invention

In the exposure device according to the present invention, exposure light from the first light source and exposure light from the second light source are caused to intersect on the optical path between the first and second light sources and the alignment material film, and irradiate regions that correspond to split regions of the picture elements, or to regions including a plurality of pixels lined up in the scanning direction, in the alignment material film. In so doing, the distance between the light sources can be shorter, as compared to the case in which the exposure light does not intersect. Therefore, as compared with conventional exposure devices, the exposure device of the present invention has a wider range in which irradiation can take place free from interference of the device with the exposure light, and the alignment material film can be exposed in the normal manner, even when the angle of the exposure light with respect to the surface being exposed is small.

Moreover, because the distance between the light sources can be shorter, the device can be more compact overall.

BRIEF DESCRIPTION OF THE DRAWINGS

FIG. 1(a) is a side view showing multidomain alignment by an exposure device according to a first embodiment of the invention, and (b) is a perspective view thereof;

FIG. 5(a) is a side view showing multidomain alignment exposure by an exposure device according to a second embodiment of the invention, and (b) is a perspective view thereof;

FIG. 7(a) is a side view showing multidomain alignment exposure by an exposure device according to a third embodiment of the invention, and (b) is a perspective view thereof;

FIG. 9(a) is a side view showing multidomain alignment exposure by a conventional exposure device, and (b) is a perspective view thereof;

EMBODIMENTS FOR CARRYING OUT THE INVENTION

Figure 2:
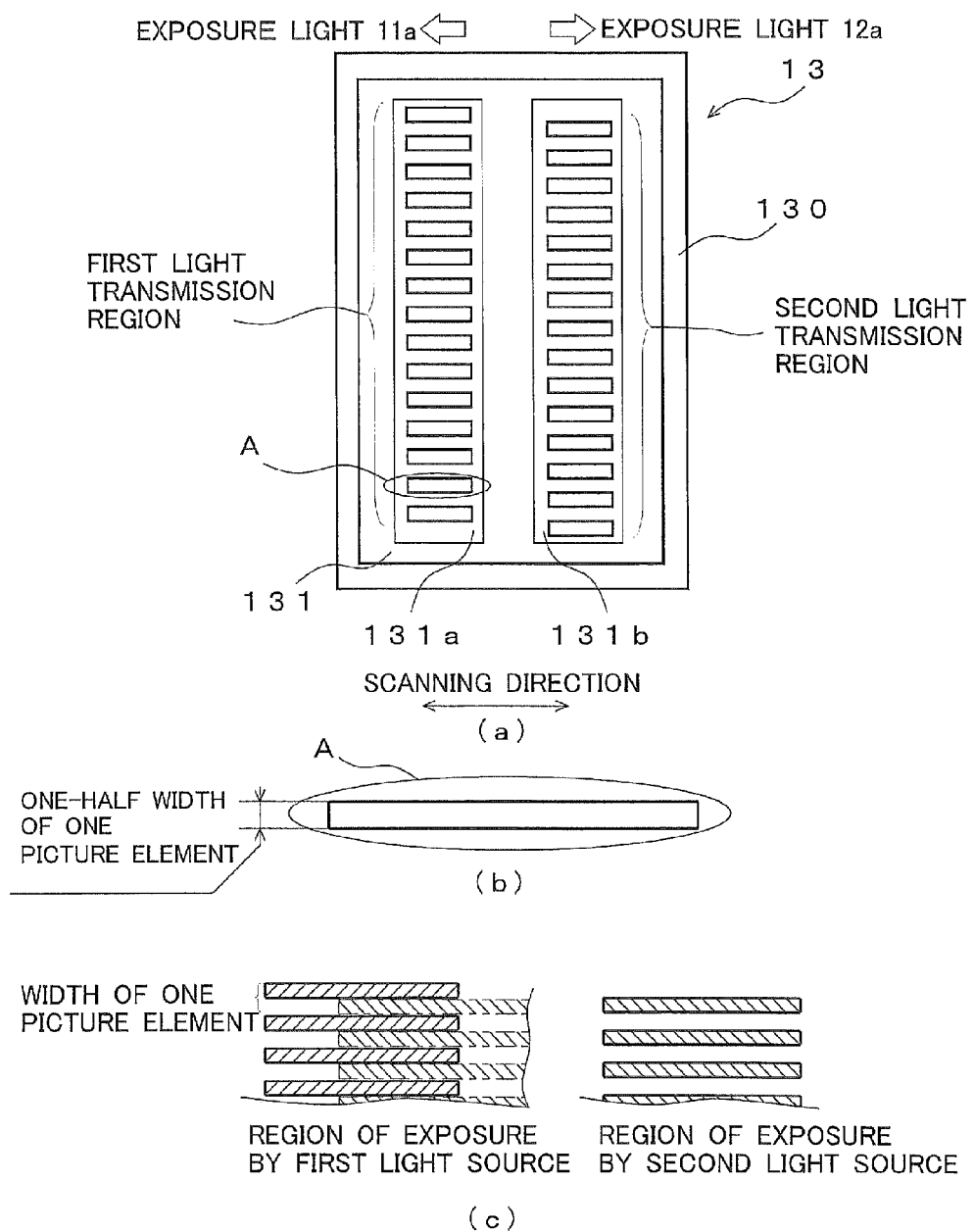
FIG. 2(a) is a plan view showing a mask in the exposure device according to the first embodiment of the invention, (b) is an enlarged view of section A showing a portion of a light transmission region group in FIG. 2(a), and (c) is a diagram showing an alignment film formed by a single exposure in the exposure device according to the first embodiment of the invention.
Figure 3:
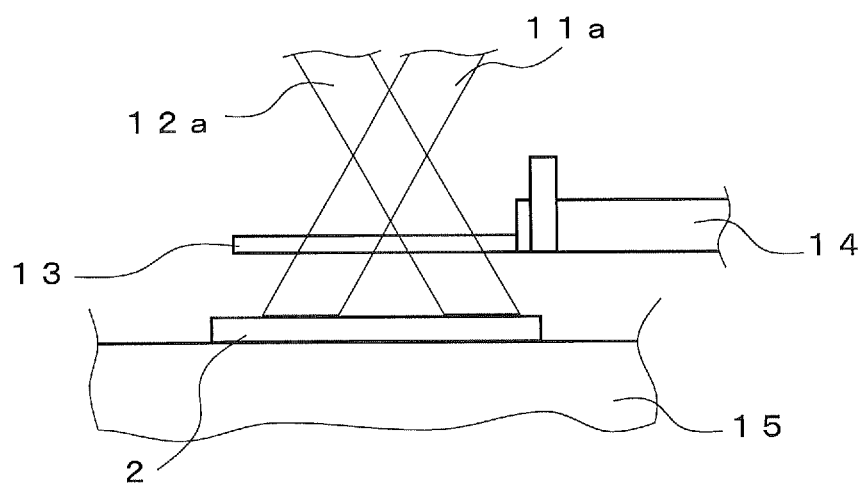
FIG. 3 is a schematic diagram showing the relationship of the mask and the exposure light in the exposure device according to the first embodiment of the invention.

The embodiments of the present invention are described in specific terms below, making reference to the accompanying drawings. Firstly, the constitution of an exposure device of a first embodiment is described. FIG. 1 (a) is a side view showing multidomain alignment by an exposure device according to a first embodiment of the invention, and (b) is a perspective view thereof. FIG. 2 (a) is a plan view showing a mask in the exposure device according to the first embodiment of the invention, FIG. 2 (b) is an enlarged view of section A showing a portion of a light transmission region group in FIG. 2(a), and FIG. 2(c) is a diagram showing an alignment film formed by a single exposure in the exposure device according to the first embodiment of the invention. FIG. 3 is a schematic diagram showing the relationship of the mask and the exposure light in the exposure device according to the first embodiment of the invention. In the present embodiment, a case in which the light transmission regions are constituted so as to extend in the scanning direction, with each light transmission region corresponding to a region that includes a plurality of pixels lined up in the scanning direction, and regions of uniform alignment direction are formed to extend in a band in the scanning direction, through continuous exposure.

As shown in FIG. 1, the exposure device 1 is constituted by two light sources (a first light source 11 and a second light source 12) for outputting exposure light 11a, 12a; a mask 13 having a pattern formed on the surface; and a mask stage 14 for supporting the mask 13. A member for exposure 2 (for example, a glass substrate with an alignment material film formed on the surface) supported on a stage 15 is irradiated with the exposure light 11a, 12a, and aligned in predetermined directions. In FIGS. 1, 2, and other drawings, the member for exposure 2 is shown as being slightly larger than the mask; however, the present invention imposes no limitation as to the size of the member for exposure 2.

The first and second light sources 11, 12 are light sources for respectively outputting ultraviolet light, for example. Mercury lamps, xenon lamps, excimer lamps, ultraviolet LEDs, and the like, for example, are suitable for use. A collimator lens and/or a reflecting mirror or the like, for example, are disposed respectively on the optical paths of the exposure light output by the first and second light sources 11, 12, so that, for example, the alignment material film on the surface of the member for exposure 2 is irradiated with a predetermined quantity of light by the first and second light sources 11, 12. The output direction of the exposure light 11a, 12a can be adjusted, for example, through control of the first and second light sources 11, 12 by a control device (not illustrated). A constitution whereby the angle of incidence on the member for exposure 2 is adjustable is thereby achieved. In the exposure device 1 of the present embodiment, the beams of exposure light 11a, 12a from the first and second light sources 11, 12 are output so as to mutually intersect between the first and second light sources 11, 12 and the mask 13. In the present embodiment, both of the beams of the exposure light 11a, 12a are linear-polarized exposure light that is either P-polarized or S-polarized, for example, and do not interfere with one another even in the case of intersection on the optical paths thereof. By irradiating the alignment material film with the exposure light 11a and the exposure light 12a at respectively different pre-tilt angles, the alignment directions of the liquid crystal molecules can be made to differ from one another, and, for example, the alignment direction of the alignment film can be increased to two directions for each single picture elements or each of adjacent pixels in the width direction, to increase the viewing angle of a liquid crystal display or the like.

As shown in FIG. 1(b), the mask 13 is constituted, for example, by a frame 130 and a pattern formation portion 131 at the center thereof. As shown in FIG. 2(a), in the pattern formation portion 131, there are formed a first light transmission region group 131a and a second light transmission region group 131b in which a plurality of light transmission regions are respectively arrayed in a single row in a direction perpendicular to the scanning direction and corresponding respectively to the exposure light from the first or second light source 11, 12. In the present embodiment, the first light transmission region group 131a and the second light transmission region group 131b are disposed spaced apart in the direction of relative scanning of the alignment material film with respect to the mask 13. As shown in FIG. 2(b), the respective plurality of light transmission regions correspond to regions that extend in the scanning direction and include a plurality of pixels lined up in the scanning direction. The light transmission regions of the first light transmission region group 131a and the light transmission regions of the second light transmission region group 131b are arrayed with intervals therebetween such that there is no overlap in the scanning direction. For example, the light transmission regions of the first light transmission region group 131a and the light transmission regions of the second light transmission region group 131b are arrayed in staggered fashion to one another along a direction perpendicular to the scanning direction, such that there is no overlap in the scanning direction. In the present embodiment, the light transmission regions of the first and second light sources 11, 12 are apertures of a shape for transmitting the exposure light 11a, 12a, or light-transmissive members. By irradiating the respectively different regions 131a, 131b of the mask 13 with the exposure light 11a, 12a from the first and second light sources 11, 12 from different directions, the light transmitted through the light transmission regions irradiates and exposes the alignment material film on the surface of the member for exposure 2, which is supported on the stage 15. As shown in FIG. 2(a), in the present embodiment, of the light transmission regions of the pattern formation portion 131, the first light transmission region group 131a corresponding to the exposure light 11a output from the first light source 11 is formed to the second light source 12 side, and the second light transmission region group 131b corresponding to the exposure light 12a output from the second light source 12 is formed to the first light source 11 side. Therefore, as shown in FIG. 2(c), in the present embodiment, the areas exposed by the exposure light 11a from the first light source 11 and the areas exposed by the exposure light 12a from the second light source 12 are situated mutually spaced apart.

The mask stage 14 supports the frame 130 of the mask 13, to the first light source 11 side. In the present invention, the light source on the mask stage 14 side is termed the first light source 11; however, the designations "first" and "second" have no particular significance. The mask stage 14 is either affixed to another component, not illustrated, inside the exposure device, or is constituted such that the mask stage 14 can move in coincidence with the area being exposed by the exposure light. For example, the mask stage 14 is moveable in the horizontal direction, in coincidence with the angle of slope of the exposure light 11a and/or the exposure light 12a with respect to the exposure surface of the member for exposure 2. For example, the mask stage 14 is constituted to be moveable in the vertical direction as well.

The stage 15 supporting the member for exposure 2 is adjustable in position through computer control, for example. By moving the stage 15 after the member for exposure 2 has been placed thereon, the area irradiated by the exposure light on the surface of the member for exposure 2 can be moved. In so doing, a plurality of areas on the member for exposure 2 can be exposed in succession.

As shown in FIG. 2, in the present embodiment, the areas on the surface of the member for exposure 2 which are irradiated by the two beams of exposure light 11a, 12a transmitted through the mask 13 are areas, corresponding to the apertures or light-transmissive members of the mask, in which a plurality of picture elements (constituted by three R, G, and B picture elements) of a liquid crystal display or the like line up in one direction (the scanning direction of the exposure device), with the areas exposed by the exposure light 11a from the first light source 11 and the areas exposed by the exposure light 12a from the second light source 12 being at positions mutually spaced apart. Consequently, while simultaneous exposure of areas of mutually adjacent pixels is not possible, unexposed adjacent pixels are exposed by the other beam of exposure light, by carrying out exposure while moving the stage 15. Specifically, in the present embodiment, exposure of mutually adjacent pixels is carried out at staggered timing, forming an alignment film of mutually adjacent areas exposed by the exposure light 11a output from the first light source 11 and areas exposed by the exposure light 12a output from the second light source 12.

As shown in FIG. 9, in a conventional exposure device, two beams of exposure light at different output angles irradiate mutually adjacent regions equivalent to one-half of one picture element, or pixels adjacent in the width direction, so that a single picture element, or pixels adjacent in the width direction, are respectively exposed simultaneously by two different light sources. In contrast to this, in the exposure device 1 of the present embodiment, the exposure light 11a, 12a from the first and second light sources 11, 12 is output in such a way that the beams intersect on the optical path between the first and second light sources 11, 12 and the mask 13, and are respectively transmitted through the pattern lying towards the other light source, with the two beams of exposure light irradiating the surface of the member for exposure 2 at mutually spaced apart locations. Therefore, in the present embodiment, the distance between the first light source 11 and the second light source 12 can be shorter, and the device can be smaller overall.

The operation of the exposure device of the present embodiment is described next. Before initiating exposure, firstly, the member for exposure 2, for example, a glass substrate on which an alignment material film of predetermined thickness has been formed on the top surface, is placed on the stage 15. At this time, the position of the member for exposure 2 is adjusted, for example, so that the surface for exposure of the alignment material film on the member for exposure 2 is parallel to the top surface of the stage 15. Moreover, the position of the member for exposure 2 is adjusted, for example, so that the zone for exposure of the alignment material film lies within the exposure region of the exposure light. In preferred practice, this adjustment of the position of the member for exposure 2 is performed after placing the member for exposure 2 on the stage 15, through movement of the stage, which is moveable by computer control for example. In so doing, a plurality of regions can be exposed in succession on the member for exposure 2.

Next, the directions in which to align the alignment material film are determined for each region that will become a pixel lined up in the scanning direction. The directions of output of exposure light from the first and second light sources 11, 12 are then determined in corresponding fashion with the alignment directions so determined, in such a way that the split regions will be irradiated with exposure light at predetermined angles. Next, the distance between the first light source 11 and the second light source 12 is adjusted in such a way that predetermined regions of the alignment material film formed on the member for exposure 2 can be irradiated with the exposure light, and the position of the patterns of light transmission regions of the mask 13 are adjusted through adjustment of the position of the mask stage 14. The mask 13 is selected to coincide with the pattern to be exposed on the alignment material film.

In the present embodiment, the positions of the first light source 11 and the second light source 12 are adjusted such that the exposure light 11a output from the first light source 11 and the exposure light 12a output from the second light source 12 mutually intersect on the optical path prior to irradiating the pattern formation portion 131 of the mask 13. Consequently, the distance between the first light source 11 and the second light source 12 can be shorter, as compared with a conventional exposure device. Therefore, irradiation by the exposure light 11a, 12a can take place over a wider range free from interference by the device itself (for example, by the mask stage 14 or the frame 130 of the mask).

Once the positions of the first and second light sources 11, 12 and the mask 13 have been determined, next, exposure light is output from the light sources. The exposure light 11a, 12a output from the light sources is transmitted or reflected by optical members, such as a collimator lens and/or mirror, or the like for example, directing a predetermined quantity of light onto the mask 13.

In the present embodiment, the exposure light 11a output from the first light source 11 and the exposure light 12a output from the second light source 12 mutually intersect on the optical path leading to the pattern formation portion 131. However, the exposure light 11a, 12a is directed onto the alignment material film in a manner free of mutual interference between them. Because the two beams of exposure light 11a, 12a are made to mutually intersect, even when the angle of slope of the exposure light 11a, 12a with respect to surface for exposure is small, the exposure light 11a, 12a is directed onto the predetermined light transmission regions 131a, 131b of the mask 13 in a manner free of interference with the mask stage or the like. When the exposure light 11a, 12a irradiates the respective corresponding light transmission regions 131a, 131b of the pattern formation portion 131, the exposure light 11a, 12a is transmitted through the mask 13 in a manner corresponding to the pattern of light transmission regions of the pattern formation portion 131, and the light transmitted through the mask is directed onto the member for exposure 2.

The exposure light 11a and the exposure light 12a irradiate regions mutually spaced apart on the alignment material film. In the present embodiment, the regions irradiated through the light transmission regions of the mask 13 by the exposure light 11a and the exposure light 12a are, for example, a plurality of regions corresponding to pixels (constituted by three R, G, B picture elements) of a liquid crystal display or the like, which line up in one direction (the scanning direction in the exposure device), with the regions that will constitute the plurality of pixels lined up in the scanning direction being respectively exposed through the respective plurality of light transmission regions that have been formed in the pattern formation portion 131 of the mask 13 (and that line up in the width direction perpendicular to the scanning direction). In the regions irradiated by the exposure light 11a and the exposure light 12a, the alignment material film, due to its photo-degradation characteristic, aligns in predetermined directions corresponding to the angle of irradiation by the exposure light. Therefore, the alignment material film, in the regions thereof irradiated by the exposure light 11a, aligns in a first direction dependent on the angle of incidence of the exposure light 11a, while the alignment material film, in the regions thereof irradiated by the exposure light 12a, aligns in another second direction different from the first direction and dependent on the angle of incidence of the exposure light 12a. In so doing, for the plurality of pixels lined up in the scanning direction, alignment film aligned in the first direction, and alignment film aligned in the second direction, is formed so as to extend in a band in the scanning direction. In the present embodiment, the exposure light 11a, 12a irradiating the alignment material film can expose the alignment material film in the normal manner free from interference by the device itself on the optical path.

In a state of continued irradiation by the exposure light 11a, 12a in this manner, by moving the stage 15 through computer control, and moving the member for exposure 2 at a constant speed along the scanning direction for example, the member for exposure 2 is continuously exposed through continuous irradiation by the exposure light 11a, 12a. In so doing, adjacent pixels unexposed by one exposure light are ultimately exposed by the other exposure light, forming an alignment film of mutually adjacent exposed regions produced by the exposure light 11a of the first light source 11 and exposed regions produced by the exposure light 12a of the second light source 12.

Once all of the regions for exposure on the member for exposure 2 have been exposed, the member for exposure 2 is ejected from the exposure device 1, for example, by moving the stage 15. In this way, there may be manufactured, on a glass substrate for example, an alignment film in which regions of band shape of uniform alignment direction are formed to correspond to pixels lined up in the scanning direction, with the alignment directions differing between adjacent pixels in a direction perpendicular to the scanning direction. Liquid crystals are then sandwiched between the alignment films of two glass substrates manufactured in this manner. Thereupon, the calamitic molecules of the liquid crystals orient in a predetermined direction due to the alignment direction of the alignment films. In so doing, a multidomain alignment system liquid crystal display material affording a wide viewing angle is perfected. Polarized films, such as those for a 3D display, can also be manufactured by the method for forming an alignment film as in the present embodiment. Specifically, by irradiating individual regions to constitute adjacent pixels in the width direction of the film for example, by exposure light from two light sources, doing so with exposure light of linear-polarized light, namely, P-polarized light and S-polarized light in alternating fashion, the alignment direction of the alignment material film can be varied in each of the pixels constituted by a plurality of picture elements. In so doing, there can be obtained an alignment film having a function comparable to a ¼λ panel in which the alignment directions at the film surface mutually differ by 90°, and the resulting film can be used as a polarized film. Specifically, by causing light for image display, which is linear-polarized light, to be transmitted through the polarized film, each of display rows constituted by a plurality of pixels and extending in the width direction of the film can be made to output transmitted light which is circular-polarized light of mutually opposite rotation directions. These two beams of transmitted light of circular-polarized light can be used respectively as display light for the right eye and the left eye in a 3D display, for example.

In the above manner, in the exposure device 1 of the present embodiment, the exposure light 11a, 12a is output in such a way as to mutually intersect on the optical path between the first and second light sources 11, 12 and the mask 13, and therefore the distance between the first light source 11 and the second light source 12 can be smaller, and the alignment material film can be exposed in the normal manner, even when the angle of the exposure light 11a, 12a with respect to the surface for exposure is small.

Figure 4:
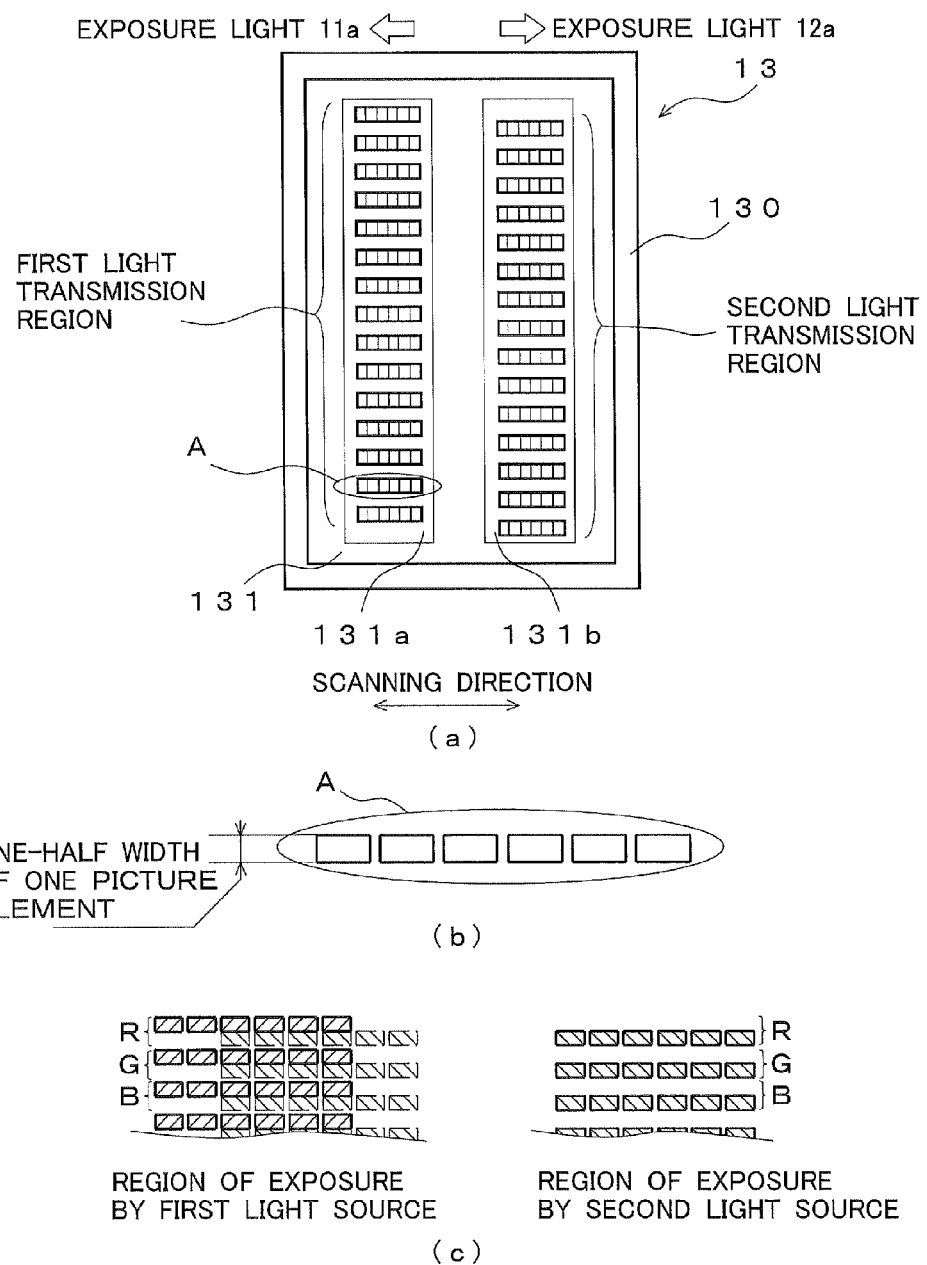
FIG. 4(a) and (b) are diagrams showing a modification of the mask in the exposure device according to the first embodiment of the invention, and (c) is a diagram showing an alignment film formed by the mask of FIG. 4(a) and (b)

As shown in FIG. 2(b), in the present embodiment, the light transmission regions of the first and second light transmission region groups 131a, 131b of the mask 13 respectively correspond to regions that include a plurality of pixels lined up in the scanning direction; however, this represents a case in which an alignment film of uniform alignment direction extending in the scanning direction is formed by continuous exposure to exposure light. The present invention is not limited to this mode, and can be applied in a case in which a member for exposure is exposed through intermittent irradiation by exposure light as well. Specifically, as shown in FIG. 4(a) and FIG. 4(b) for example, the light transmission regions of the first and second light transmission region groups 131a, 131b can be split into a plurality of regions in the scanning direction (in FIG. 4(b), six), with each of these light transmission regions corresponding to a region equivalent to a single picture element split in two in the width direction perpendicular to the scanning direction. In so doing, regions corresponding to a plurality of picture elements can be exposed through a single exposure cycle. The member for exposure 2 is then moved, for example by the stage 15, at a constant speed on the horizontal along the scanning direction, for example, towards the first light source 11 side or the second light source side 12, while performing exposure through irradiation with exposure light, each time that it has moved by a distance of movement equal to the length of the pattern in the scanning direction (in the present modification, a length equivalent to six picture elements (see FIG. 4)). In this case, however, it is preferable that the regions irradiated on the surface of the member for exposure 2 by the two beams of exposure light be spaced apart, for example, by an integral multiple of the picture element length. Specifically, as shown in FIG. 4 (c), in the present modification as well, the regions exposed by the first light source 11 and the regions exposed by the second light source 12 are mutually spaced apart; and by adopting an integral multiple of the picture element length as the distance therebetween, in picture elements in which a region equivalent to one-half thereof has already been exposed by one of the light sources, the region equivalent to the other half can be exposed by the other light source, in accurately matching fashion. In so doing, there is manufactured a film in which a plurality of regions equivalent to single picture elements split into two, and in which the alignment film in each split region of the regions is respectively formed with a different alignment direction, are lined up in a matrix arrangement.

In the present embodiment, the configuration is such that the stage 15 is moveable along the scanning direction by computer control; however, in the exposure device of the present invention, there is no limitation to the mode of the present embodiment, and the direction in which the stage 15 is moved can be controlled by computer as well, for example. Specifically, in case in which stepped exposure is performed, as in the aforedescribed modification for example, the direction in which the stage 15 is moved can be controlled in such a way that, after completing formation of the alignment film in a first zone for exposure, the regions in which the pattern has been formed are moved in the width direction, which is the direction in which the picture elements are split, for example. In so doing, zones for exposure situated adjacently in the width direction of the picture elements are exposed in succession. Moreover, even in cases in which, for example, the disposition of the zones for exposure in the member for exposure 2 is not such that they are mutually adjacent (continuous), by moving the stage 15 and disposing the zones for exposure in regions irradiated by the exposure light, the zones for exposure can undergo stepped exposure in succession.

Figure 6:
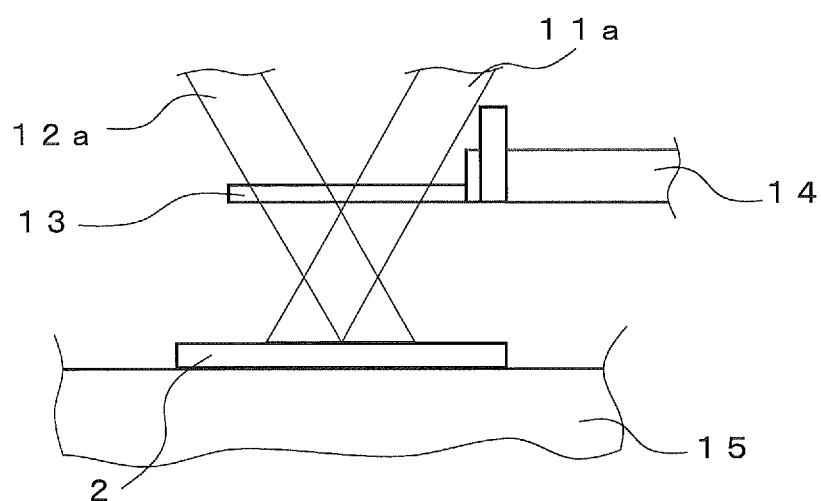
FIG. 6 is a schematic diagram showing the relationship of the mask and the exposure light in the exposure device according to the second embodiment of the invention.

Next, an exposure device according to a second embodiment of the present invention is described. FIG. 5 (*a*) is a side view showing multidomain alignment exposure by an exposure device according to a second embodiment of the invention, and (*b*) is a perspective view thereof. FIG. 6 is a schematic diagram showing the relationship of the mask and the exposure light in the exposure device according to the second embodiment of the invention.

The first embodiment was constituted such that the exposure light 11*a*, 12*a* outputted by the first and second light sources 11, 12 intersect between the first and second light sources 11, 12 and the mask 13. In the present embodiment, however, intersection position of the two beams of exposure light 11*a*, 12*a* output by the first and second light sources 11, 12 is between the mask 13 and the alignment material film, as shown in FIGS. 5 and 6.

Moreover, the positions of the mask 13 and the mask stage 14 are further away from the member for exposure 2, as compared with the first embodiment. The constitution is otherwise comparable to the first embodiment.

In the present embodiment, because the exposure light 11*a*, 12*a* mutually intersects between the mask 13 and the alignment material film, as shown in FIG. 5, the distance between the first light source 11 and the second light source 12 must be slightly greater than in the case of the first embodiment, but the device overall can still be smaller in size than in the past.

Moreover, the range in which irradiation by the exposure light 11*a*, 12*a* can take place free from interference by the device itself (for example, by the mask stage 14 or the frame 130 of the mask) is wider than in a conventional exposure device, and even when the angle of slope of the exposure light 11*a*, 12*a* with respect to the surface for exposure is small, the alignment material film can be irradiated by the exposure light 11*a*, 12*a* free from interference by the mask stage or the like, and the alignment material film can be exposed in the normal manner.

In the present embodiment, as in the first embodiment, the light transmission regions of the first and second light transmission region groups 131*a*, 131*b* are constituted so as to extend in the scanning direction as shown in FIG. 2(*a*) and FIG. 2(*b*) for example; and by causing the exposure light to be continuously transmitted through the light transmission regions while moving the member for exposure 2 at constant speed along the scanning direction, for example, the member for exposure 2 may be continuously irradiated and exposed by the exposure light, to obtain an oriented film of uniform alignment direction in regions of band shape along the scanning direction, whereby a polarized film for use in a 3D display, for example, can be manufactured. In this case as well, because there is no need for the exposure regions having been split into two and constituting picture elements to be adjacent, there is no limitation as to the distance in the scanning direction between the regions irradiated by the two beams of exposure light.

Regions irradiated by the exposure light 11*a* from the first light source 11 and regions irradiated by the exposure light 12*a* from the second light source 12 are positioned mutually spaced apart on the surface of the member for exposure 2 as shown in FIG. 6. In a case in which exposure regions that correspond to a plurality of picture elements are exposed each time that regions are irradiated with the exposure light while intermittently outputting exposure light, the distance between these irradiated regions may be set to an integral multiple of the length of a single picture element, for example, as in the first embodiment. In so doing, as in the case of the modification of the first embodiment, after exposure has been completed in the state shown in FIG. 6, by then, for example by moving the stage 15 to move the member for exposure 2 at a constant speed while irradiating the member for exposure with exposure light each time that it has moved by the equivalent of the length of the pattern in the scanning direction (in the case of use of the mask 13 like that shown in FIG. 4, a length equivalent to six picture elements), there can be obtained an alignment film in which the areas exposed by the exposure light 11*a* and the areas exposed by the exposure light 12*a* are adjacent, with regions equivalent to one-half a single pixel element being aligned in respectively different directions. Specifically, in the present embodiment as well, regions equivalent to a single picture element split into two are exposed at staggered timing. In so doing, there is manufactured a film in which a plurality of regions equivalent to single picture elements split into two, and in which the alignment film in each split region of the regions is respectively formed with a different alignment direction, are lined up in a matrix arrangement.

Figure 8:
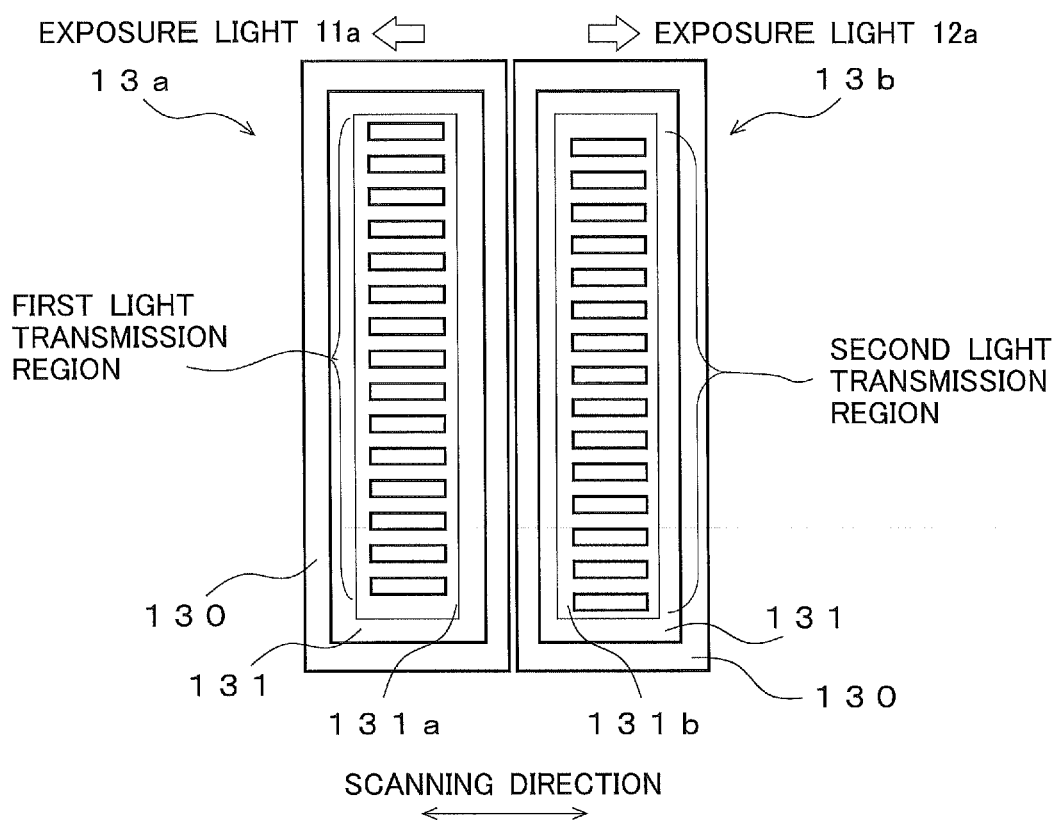
FIG. 8 is a plan view showing the mask in the exposure device according to a third embodiment of the invention.
Figure 10:
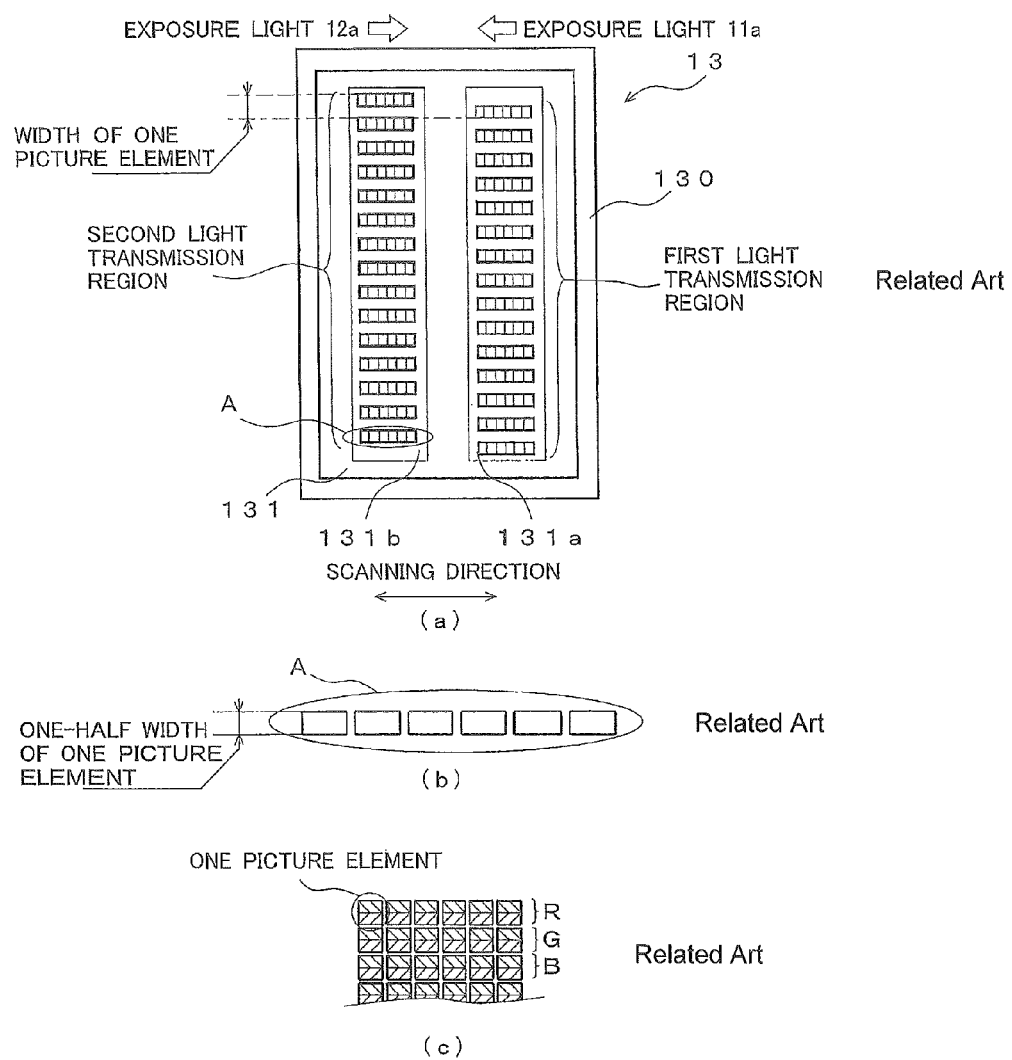
FIG. 10(a) is a plan view showing a mask in a conventional exposure device, (b) is an enlarged view of section A showing a portion of a light transmission region group in FIG. 10(a), and (c) is a diagram showing an alignment film formed by a single exposure in the conventional exposure device.
Figure 11:
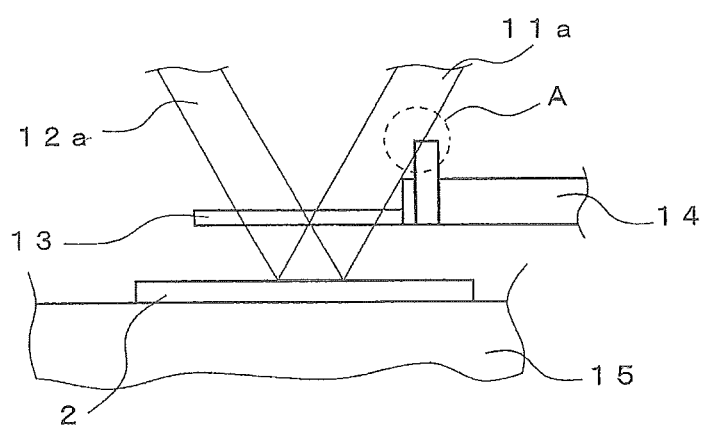
FIG. 11 is a schematic diagram showing the relationship of the mask and the exposure light in the conventional exposure device.

An exposure device according to a third embodiment of the present invention is described next. FIG. 7(*a*) is a side view showing multidomain alignment exposure by an exposure device according to a third embodiment of the invention, and (*b*) is a perspective view thereof. FIG. 8 is a plan view showing the mask in the exposure device according to a third embodiment of the invention.

As shown in FIG. 7, in the present embodiment, the mask 13 in the first embodiment has been split into a first mask 13*a* for transmission of the exposure light 11*a* from the first light source 11, and a second mask 13*b* for transmission of the exposure light 12*a* from the second light source 12. Consequently, as shown in FIG. 7(*b*) and FIG. 8, the first light transmission region group 131*a* for transmission of the exposure light 11*a* from the first light source 11 is furnished to the first mask 13*a*, while the second light transmission region group 131*b* for transmission of the exposure light 12*a* from the second light source 12 is furnished to the second mask 13*b*. As in the first and second embodiments, the first and second light transmission region groups 131*a*, 131*b* are respectively disposed in a single row so as to line up in a direction perpendicular to the scanning direction. The respective plurality of light transmission regions extend in the scanning direction, and correspond to regions that include a plurality of pixels lined up in the scanning direction. The first mask 13*a* and the second mask 13*b* are respectively supported on mask stages 14, and are thereby constituted such that the first mask 13*a* and the second mask 13*b* are respectively moveable independently. Specifically, in the present embodiment, as shown in FIG. 7, the mask stage 14 that supports the first mask 13*a* is disposed on the second light source 12 side, while the mask stage 14 that supports the second mask 13*b* is disposed on the first light source 11 side. The constitution is otherwise comparable to the first embodiment.

In the present embodiment, as in the exposure device of the first embodiment, the distance between the first light source 11 and the second light source 12 can be smaller, the device can be made more compact in size overall, and the range in which irradiation by the exposure light 11a, 12a can take place free from interference by the device itself (for example, by the mask stages 14 or the frame 130 of the mask) is wider; moreover, even when the angle of slope of the exposure light 11a, 12a with respect to the surface for exposure is small, the alignment material film can be exposed in the normal manner. Furthermore, in the present embodiment, the mask 13 has been split into the first mask 13a and the second mask 13b which are respectively supported by the mask stages 14 so as to be moveable independently, whereby the position of the mask, the quantity of the exposure light irradiating the member for exposure 2, and other variables can be adjusted for each light source. Consequently, in a case in which, for example, the exposure light from one of the light sources fails to irradiate a predetermined quantity of light onto the member for exposure 2, the mask 13a or the mask 13b for transmitting the target exposure light can be moved by the mask stage 14 to adjust the position or quantity of the exposure light.

In the present embodiment, as in the first and second embodiments, the light transmission regions of the first and second light transmission region groups 131a, 131b are constituted so as to extend in the scanning direction as shown in FIG. 2(a) and FIG. 2(b) for example; and by causing the exposure light to be continuously transmitted through the light transmission regions while moving the member for exposure 2 at constant speed along the scanning direction, for example, the member for exposure 2 may be continuously irradiated and exposed by the exposure light, to obtain an oriented film of uniform alignment direction in regions of band shape along the scanning direction, whereby a polarized film for use in a 3D display, for example, can be manufactured.

In the present embodiment as well, as shown, for example, in FIG. 4(a) and FIG. 4(b), stepped exposure may be performed while splitting the light transmission regions of the first and second light transmission regions light transmission region groups 131a, 131b into a plurality of regions along the scanning direction, with each light transmission region corresponding to a region equivalent to one picture element split into two in the width direction perpendicular to the scanning direction; and a film in which a plurality of regions equivalent to single picture elements split into two, and in which the alignment film in each split region of the regions is respectively formed with a different alignment direction, are lined up in a matrix arrangement, can be manufactured.

INDUSTRIAL APPLICABILITY

The exposure device of the present invention photoaligns an alignment material film by splitting portions of the alignment material film which correspond to picture elements of a liquid crystal display device into two parts, and exposing these from different directions; or by exposing portions which correspond to pixels from a different direction in each adjacent pixel in the width direction thereof. In this way, with the exposure device of the present invention, during manufacture of an alignment material film for a liquid crystal display device displaying three-dimensional images, the alignment material film can undergo multidomain exposure in a predetermined pattern in the normal manner.

KEY

1 Exposure device
11 First light source
12 Second light source
11a Exposure light (from first light source)
12a Exposure light (from second light source)
13 Mask
13a First mask
13b Second mask
130 Frame
131 Pattern formation portion
131a First light transmission region group
131b Second light transmission region group
14 Mask stage
15 Stage
2 Member for exposure.

The invention claimed is:

1. An exposure device, in which each of sections of an alignment material film corresponding to picture elements of a liquid crystal display device is split into two parts in a width direction of the picture elements and the two parts are exposed from different directions of each other, whereby the alignment material film is photoaligned, the exposure device comprising:
   a first light source and a second light source for outputting exposure light;
   a mask in which there are formed a first light transmission region group in which a plurality of light transmission regions for transmitting the exposure light from said first light source are arrayed in a single row and a second light transmission region group in which a plurality of light transmission regions for transmitting the exposure light from said second light source are arrayed in a single row;
   a mask support portion for supporting said mask, the mask support portion being disposed towards said first light source; and
   a movement device for causing the alignment material film and said mask to move relative to each other so that the alignment material film is scanned using said exposure light;
   said first and second light transmission region groups being disposed spaced apart in a direction of relative scanning of said alignment material film with respect to said mask;
   the plurality of light transmission regions respectively corresponding to regions equivalent to one-half of one picture element split in the width direction;
   the light transmission regions of said first light transmission region group and the light transmission regions of said second light transmission region group being arrayed, in a direction perpendicular to said scanning direction, with intervals therebetween such that there is no overlap in said scanning direction; and
   the exposure light from said first light source and said second light source being caused to be inclined so as to mutually intersect above said mask on an optical path between said first and second light sources and said mask and being transmitted through said first light transmission region group and said second light transmission region group of said mask so that regions of said alignment material film which correspond to split regions of picture elements are irradiated.

2. The exposure device according to claim 1, wherein a position of an intersection of the exposure light from said first light source and the exposure light from said second light source is between said first and second light sources and said mask.

3. The exposure device according to claim 1, a position of an intersection of the exposure light from said first light source and the exposure light from said second light source is between said mask and said alignment material film.

4. The exposure device according to claim 1, wherein the exposure light from said first light source is transmitted to an adjacent side of the mask to said second light source, which is located farther than an adjacent side of the mask to said first light source.

5. The exposure device according to claim 4, wherein the exposure light from said second light source is transmitted to the adjacent side of the mask to said first light source.

6. The exposure device according to claim 1, wherein, in the scanning direction, the light transmission regions of said first light transmission region group are located in a side of said second light source on the mask.

7. The exposure device according to claim 1, wherein, in the scanning direction, the light transmission regions of said second light transmission region group are located in a side of said first light source on the mask.

8. The exposure device according to claim 1, wherein, with respect to a centerline of the mask in the direction perpendicular to said scanning direction, an entirety of the light transmission regions of said first light transmission region group are located in a side of said second light source on the mask.

9. The exposure device according to claim 1, wherein the exposure light from the first light source and the exposure light from the second exposure light mutually intersect on the optical path prior to irradiating the regions of said alignment material film.

10. An exposure device, in which each of sections of an alignment material film corresponding to picture elements of a liquid crystal display device is split into two parts in a width direction of the picture elements and the two parts are exposed from different directions of each other, whereby the alignment material film is photoaligned, the exposure device comprising:
a first light source and a second light source for outputting exposure light;
a first mask in which is formed a first light transmission region group in which a plurality of light transmission regions for transmitting the exposure light from said first light source are arrayed in a single row;
a first mask support portion for supporting said first mask, the first mask support portion being disposed towards said second light source;
a second mask in which is formed a second light transmission region group in which a plurality of light transmission regions for transmitting the exposure light from said second light source are arrayed in a single row;
a second mask support portion for supporting said second mask; and
a movement device for causing said alignment material film and said first and second masks to move relative to each other so that the alignment material film is scanned using said exposure light;
the respective plurality of the light transmission regions of said first and second light transmission region groups corresponding to regions equivalent to one-half of one picture element split in the width direction,
the light transmission regions of said first light transmission region group and the light transmission regions of said second light transmission region group being arrayed, in a direction perpendicular to said scanning direction, with intervals therebetween such that there is no overlap in said scanning direction, and
the exposure light from said first light source and said second light source being caused to be inclined so as to mutually intersect above said mask on an optical path between said first and second light sources and said mask and being transmitted through said first light transmission region group and said second light transmission region group of said mask so that regions of said alignment material film which correspond to split regions of picture elements are irradiated.

11. The exposure device according to claim 10, wherein, with respect to a centerline of the mask in the direction perpendicular to said scanning direction, an entirety of the light transmission regions of said first light transmission region group are located in a side of said second light source on the mask.

12. An exposure device, in which sections of an alignment material film corresponding to pixels of a liquid crystal display device are exposed from a different direction for each adjacent pixel in a width direction thereof, whereby the alignment material film is photoaligned, the exposure device comprising:
a first light source and a second light source for outputting exposure light;
a mask in which there are formed a first light transmission region group in which a plurality of light transmission regions for transmitting the exposure light from said first light source are arrayed in a single row and a second light transmission region group in which a plurality of light transmission regions for transmitting the exposure light from said second light source are arrayed in a single row;
a mask support portion for supporting said mask, the mask support portion being disposed towards said first light source; and
a movement device for causing said alignment material film and said mask to move relative to each other so that the alignment material film is scanned using said exposure light;
said first and second light transmission region groups being disposed spaced apart in a direction of relative scanning of said alignment material film with respect to said mask;
the respective plurality of light transmission regions corresponding to regions that include a plurality of pixels lined up in a scanning direction;
the light transmission regions of said first light transmission region group and the light transmission regions of said second light transmission region group being arrayed, in a direction perpendicular to said scanning direction, with intervals therebetween such that there is no overlap in said scanning direction; and
the exposure light from said first light source and said second light source being caused to be inclined so as to mutually intersect above said mask on an optical path between said first and second light sources and said mask and being transmitted through said first light transmission region group and said second light transmission region group of said mask so that regions in said alignment material film that correspond to the regions including a plurality of pixels lined up in said scanning direction are irradiated.

13. The exposure device according to claim 12, wherein the exposure light from said first light source is transmitted to an adjacent side of the mask to said second light source, which is located farther than an adjacent side of the mask to said first light source.

14. The exposure device according to claim 13, wherein the exposure light from said second light source is transmitted to the adjacent side of the mask to said first light source.

15. An exposure device, in which sections of an alignment material film corresponding to pixels of a liquid crystal display device are exposed from a different direction for each adjacent pixel in a width direction thereof, whereby the alignment material film is photoaligned, the exposure device comprising:
   a first light source and a second light source for outputting exposure light;
   a first mask in which is formed a first light transmission region group in which a plurality of light transmission regions for transmitting the exposure light from said first light source are arrayed in a single row;
   a first mask support portion for supporting said first mask, the first mask support portion being disposed towards said second light source;
   a second mask in which is formed a second light transmission region group in which a plurality of light transmission regions for transmitting the exposure light from said second light source are arrayed in a single row;
   a second mask support portion for supporting said second mask, the second mask support portion being disposed towards said first light source; and
   a movement device for causing said alignment material film and said first and second masks to move relative to each other so that the alignment material film is scanned using said exposure light,
   the respective plurality of the light transmission regions of said first and second light transmission region groups corresponding to regions that include a plurality of pixels lined up in said scanning direction,
   the light transmission regions of said first light transmission region group and the light transmission regions of said second light transmission region group being arrayed, in a direction perpendicular to said scanning direction, with intervals therebetween such that there is no overlap in said scanning direction, and
   the exposure light from said first light source and said second light source being caused to be inclined so as to mutually intersect above said first and second masks on an optical path between said first and second light sources and said first and second masks and being transmitted through said first light transmission region group and said second light transmission region group so that regions of said alignment material film that correspond to the regions including a plurality of pixels lined up in said scanning direction are irradiated.

16. The exposure device according to claim 15, wherein the exposure light from the first light source and the exposure light from the second exposure light mutually intersect on the optical path prior to irradiating the regions of said alignment material film.

* * * * *